(12) United States Patent
Ni

(10) Patent No.: US 9,626,165 B1
(45) Date of Patent: Apr. 18, 2017

(54) METHOD AND APPARATUS FOR GENERATING SYSTOLIC ARRAYS ON A TARGET DEVICE USING A HIGH-LEVEL SYNTHESIS LANGUAGE

(71) Applicant: Altera Corporation, San Jose, CA (US)

(72) Inventor: Yi Ni, San Jose, CA (US)

(73) Assignee: Altera Corporation, San Jose, CA (US)

( * ) Notice: Subject to any disclaimer, the term of this patent is extended or adjusted under 35 U.S.C. 154(b) by 465 days.

(21) Appl. No.: 14/024,860

(22) Filed: Sep. 12, 2013

(51) Int. Cl.
*G06F 17/50* (2006.01)
*G06F 9/45* (2006.01)

(52) U.S. Cl.
CPC .............. *G06F 8/41* (2013.01); *G06F 8/443* (2013.01)

(58) Field of Classification Search
USPC ........................................... 716/104
See application file for complete search history.

(56) References Cited

PUBLICATIONS

Buyukkurt, Betul; Najjar, Walid; "Compiler Generated Systolic Arrays for Wavefront Algorithm Acceleration on FPGAs," Sep. 2008, ICFPLA 2008.*
Owaida, Muhsen; Bellas, Nikolaos, Antonopoulos, Christos D.; Daloukas, Konstantis; Antoniadis, Charalambos; "Massively Parallel Programming Models Used as Hardware Description Languages: The OpenCL Case," 2011 IEEE.*

* cited by examiner

*Primary Examiner* — Eric Lee
(74) *Attorney, Agent, or Firm* — L. Cho

(57) ABSTRACT

A method for generating a description of a systolic array includes prompting a user to input information about the systolic array. A high-level synthesis language is generated that describes channels of processing elements of the systolic array and a topology of the processing elements in response to the information provided by the user.

25 Claims, 13 Drawing Sheets

METHOD AND APPARATUS FOR GENERATING SYSTOLIC ARRAYS ON A TARGET DEVICE USING A HIGH-LEVEL SYNTHESIS LANGUAGE

FIELD

Embodiments of the present invention relate to tools for designing systems on target devices. More specifically, embodiments of the present invention relate to a method and apparatus for generating systolic arrays on a target device, such as field programmable gate arrays, using a high-level synthesis language.

BACKGROUND

Systolic arrays are a pipe network arrangement of processing elements that allow data to flow synchronously between neighboring processing elements. Each processing element may receive data from one or more neighboring PE, process the data, and transmit the processed data to one or more neighboring processing element. In a two dimensional systolic array, data may be passed horizontally and vertically between PEs every clock cycle. Systolic arrays have been used in applications such as signal processing, linear algebra, string matching, sorting/searching, and other applications.

The dedicated communication paths between processing elements and the processing elements' ability to be configured to support pipelining allow systolic arrays to be efficient when performing computations. For example, for some operations, a systolic array may be able perform computations in $O(n)$ time instead of $O(n^3)$ time as required by other processing structures.

Target devices, such as field programmable gate arrays (FPGA), are good candidates for systolic array implementation due to their parallel reconfigurable hardware. FPGAs are constructed with tiling blocks of memory and logic which match well with the requirements of systolic arrays. The programmable input outputs of FPGAs also work well with the high input output requirements of systolic arrays.

Designers responsible for programming FPGAs to implement systolic arrays are required to have extensive knowledge in both the algorithm performed by the systolic array and hardware acceleration. Designers are also met with the challenge of tuning the performance of the system which may be difficult and time consuming using hardware description language.

SUMMARY

According to embodiments of the present invention, methods and apparatus for generating a systolic array on a target device using a high-level synthesis language are disclosed. Embodiments of the present invention allow for the generation of a description of a generic multi-dimensional systolic array from a scripting language. The description may adapt to a high-level synthesis language such as OpenCL, Impulse C, or other high-level synthesis language that may be converted into a hardware description language.

According to an embodiment of the present invention, a method for generating a description of a systolic array includes prompting a user to input information about the systolic array. A high-level synthesis language is generated that describes channels of processing elements of the systolic array and a typology of the processing elements in response to the information provided by the user. According to an aspect of the present invention, the high-level synthesis language further describes data transmitters and data receivers associated with the systolic array, an external interface associated with the systolic array, and/or components in the processing elements of the systolic array. According to an aspect of the present invention, optimizations are performed on the high-level synthesis language that describes the systolic array.

According to an embodiment of the present invention, a method for generating a description of a systolic array in a high-level synthesis language is disclosed. A description of a typology of the systolic array is generated in response to a dimension of the systolic array. A description of components in processing elements in the systolic array is generated in response to an algorithmic description of the processing elements. A description of channels between the processing elements is generated in response to a functional description of the processing elements. According to an aspect of the present invention, optimizations are performed on the high-level synthesis language that describes the systolic array. The optimizations may include external channel fan-out minimization, the addition of data buffers in the processing elements, and/or the reduction of clock latency for the processing elements by creating a zero-depth FIFO for each non-diagonal processor element connection.

BRIEF DESCRIPTION OF THE DRAWINGS

The features and advantages of embodiments of the present invention are illustrated by way of example and are not intended to limit the scope of the embodiments of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, procedures, and programs are shown in block diagram form to avoid obscuring embodiments of the present invention unnecessarily.

Target devices such as field programmable gate arrays (FPGAs), structured application specific integrated circuits (ASICs), and ASICs are used to implement large systems that may include million of gates and megabits of embedded memory. According to an embodiment of the present invention, an electronic design automation (EDA) tool is used to address the complexity of a large system to create and optimize a design for the system onto physical target devices.

Figure 1:
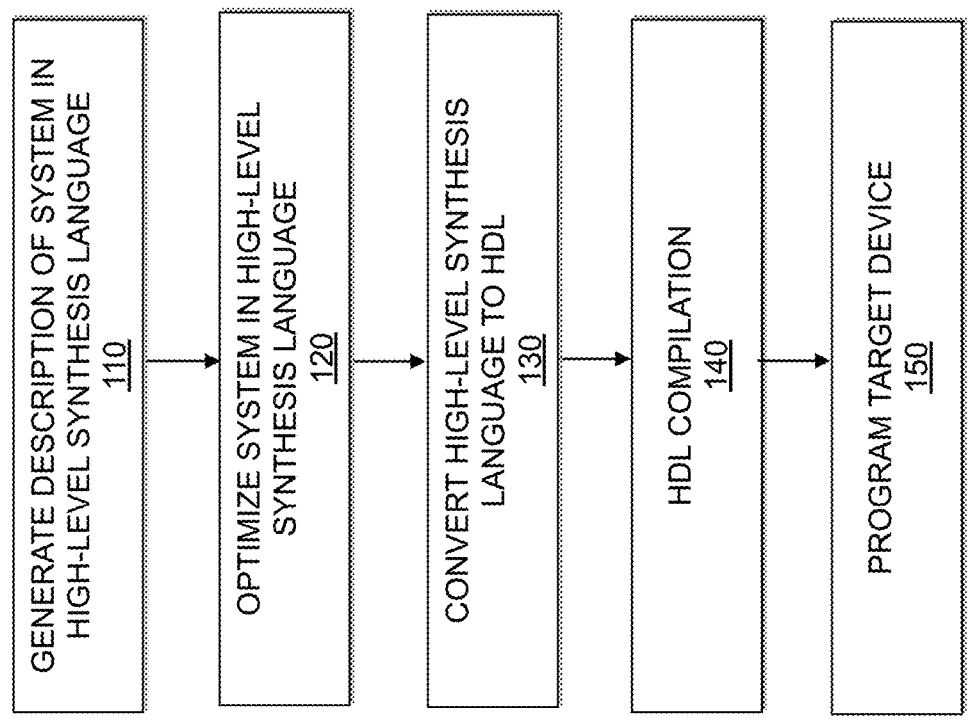
FIG. 1 is a flow chart illustrating a method for designing a system on a target device according to an exemplary embodiment of the present invention.

FIG. 1 is a flow chart illustrating a method for designing a system on a target device according to an exemplary embodiment of the present invention. The system may include one or more systolic arrays. The target device may be a FPGA, ASIC, a structured ASIC, or other device whose functionality is described by a hardware description language (HDL). According to one embodiment, the procedure illustrated in FIG. 1 may be performed by one or more computer aided design (CAD)/EDA tools implemented on a computer system.

At 110, a description of a system in high-level synthesis language is generated. According to an embodiment of the present invention, a graphical user interface prompts a user to input information about the system. The information about the system may include features and functionalities of a systolic array and components and interfaces coupled to the systolic array. The information about the system may be in the format of a script or computer language. From the information of the system provided by the user, a description of the system in high-level synthesis language is generated. The high-level synthesis language may be Open Computing Language (OpenCL), Impulse C, or other high-level synthesis language. OpenCL is a framework for writing programs that execute across heterogeneous platforms. OpenCL includes a language for writing kernels and application programming interfaces (APIs) that are used to define and control platforms.

At 120, optimizations are applied to the high-level synthesis language description of the system. According to an embodiment of the present invention, based upon the system (systolic array), and/or platform or type of target device in which the system is to be implemented, an appropriate set of optimizations are applied to improve throughput and performance. The optimizations applied may include parallelism expansion, external channel fan-out minimization, data buffering, and latency reduction.

At 130, the high-level synthesis language description of the system is converted into hardware description language (HDL). The HDL may be, for example, Verilog, VHDL or other hardware description language. According to an embodiment of the present invention, OpenCL kernel functions are converted into FPGA hardware accelerators, interface IPs are added, and interconnect logic is built.

At 140, the HDL generated at 130 is compiled into a program file. According to an embodiment of the present invention, HDL compilation involves synthesis, placement, routing, and timing analysis. According to an embodiment of the present invention, HDL compilation also involves generation of report files that describe the target device's area usage and timing information.

At 150, the target device is programmed using the program file generated at 140 to implement the system. By programming the target device, generic programmable resources on the target device may be used to implement function specific components as described in the high-level synthesis language and HDL of the system.

Figure 2:
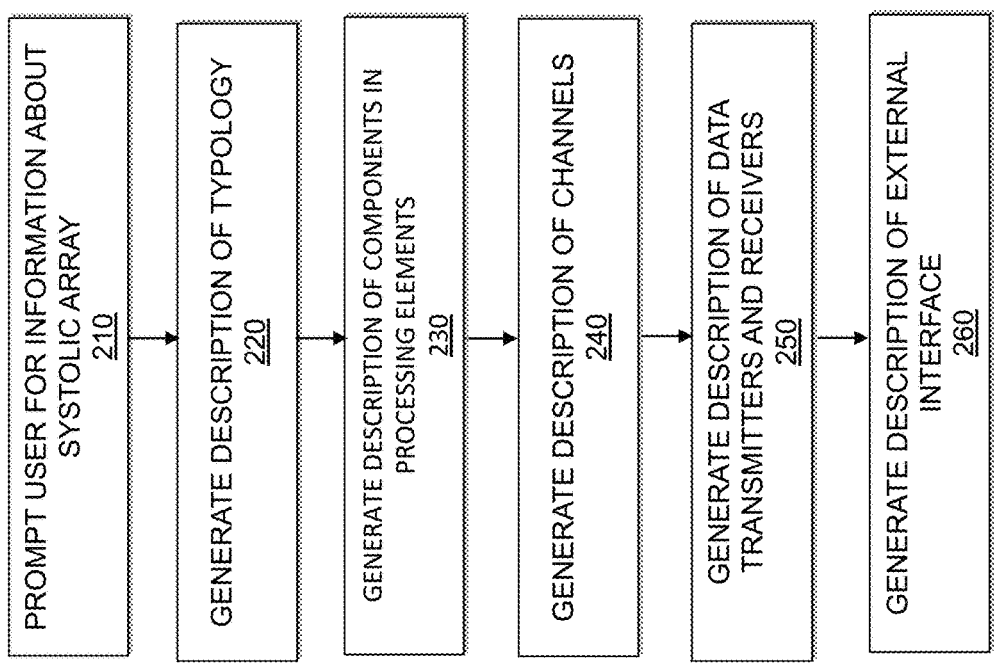
FIG. 2 is a flow chart illustrating a method for generating a description of systolic array in a high-level synthesis language according to an embodiment of the present invention.

FIG. 2 is a flow chart illustrating a method for generating a description of systolic array in a high-level synthesis language according to an embodiment of the present invention. According to an embodiment of the present invention, the procedures shown in FIG. 2 may be used to implement procedure 110 shown in FIG. 1. At 210, a user is prompted to enter information about the systolic array. According to an embodiment of the present invention, the user may be prompted for specific information about the systolic array via a graphical user interface. Alternatively, the user may be allowed to input information which the user deems important in describing the systolic array.

At 220, a description of the typology of the systolic array is generated in response to a dimension of the systolic array provided in the information. According to an embodiment of the present invention, the dimension of the systolic array may be a multi-dimensional systolic array of any specified length. For example, the systolic array may be in the form of an l×m×n matrix, where l, m, and n are integers.

At 230, a description of components in the processing elements is generated in response to an algorithmic description of the processing elements provided in the information. According to an embodiment of the present invention, the algorithmic description identifies the data received by a processing element and describes computations performed on the data by the processing element.

At 240, a description of connections (channels) between processing elements is generated in response to a functional description provided in the information. The functional description identifies external and internal channels connected to each of the processing elements and the direction data is traveling on each of the channels.

At 250, description of data transmitters and data receivers that are coupled to the processing elements via external channels is generated in response to the information. According to an embodiment of the present invention, the description may describe the type of data, location of the data, and manner in which the data is transmitted to the systolic array. The description may also describe where to store and what to do with the data received from the systolic array. In one embodiment, a description of a first channel between a data transmitter and processing elements and a second channel between the processing elements and a data receiver is generated. The description provide the processing elements with data inputs and outputs.

At 260, a description of an external interface is generated in response to the information. According to an embodiment of the present invention, a location of where input is read from and output is written to is described. According to an embodiment of the present invention, the external interface may an external memory or an input/output of the target device.

Figure 3:
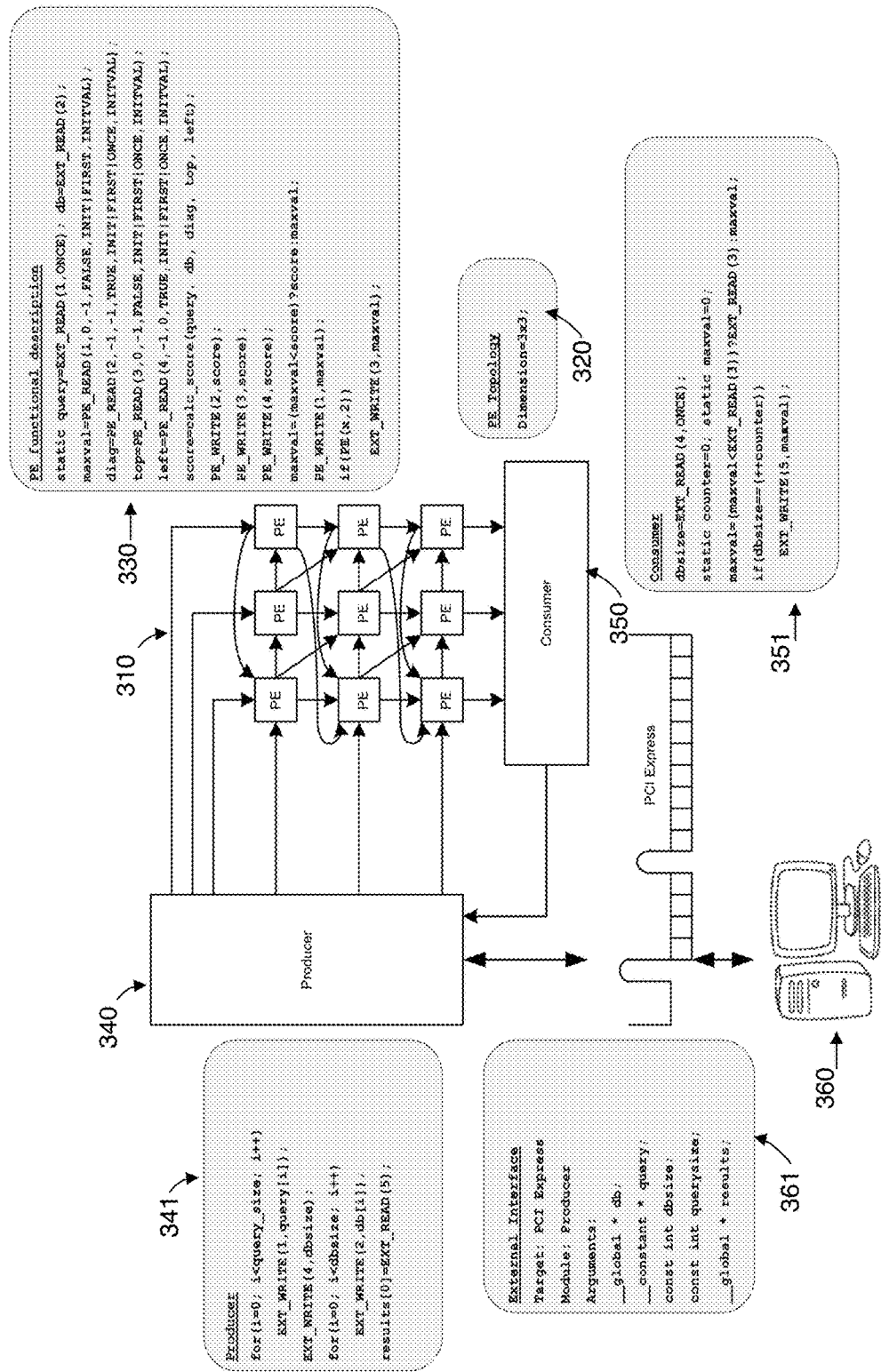
FIG. 3 illustrates an exemplary systolic array generated.

FIG. 3 illustrates an exemplary systolic array 310. According to an embodiment of the present invention, the systolic array 310 is generated using information inputted by a user. As illustrated, the topology of the systolic array 310 is in the form of a 3×3 matrix. The systolic array 310 includes 3 rows and 3 columns of processing elements ("PEs"). The topology of the systolic array 310 is generated from the dimension information 320 provided by the user.

The arrows in FIG. 3 shown pointing to and from each processing element in the systolic array 310 represent connections (channels) for transmitting data. The connections are generated from a functional description 330 provided by a user. The functional description 330 identifies external and internal channels connected to each of the processing elements and the direction data is traveling on each of the channels.

A producer (external data transmitter) 340 transmits data to the systolic array 310, and a consumer (external data receiver) 350 receives data from the systolic array 310. The producer 340 is generated from a description of the producer 341 provided by the user. The consumer 350 is generated from a description of the consumer 351 provided by the user.

An external interface 360 is coupled to the producer 340. The protocol used by the external interface 360 to communicate with the producer is specified from a description of the external interface 361.

It should be appreciated that the description of connections (channels) between processing elements may be generated in response to a functional description provided by a user in the form of an application program interfaces (APIs). For example, for connections between processing elements a user may provide a read API to describe a connection that inputs data to the processing element, and a write API to describe a connection that outputs data from the processing element. The read API may be identify a name of the connection transmitting data to a processing element, the component from which the data is originating from, initialization values to use as input data at startup, and feedback paths for processor elements that reside on the periphery of a matrix. The write API may identify a name of the connection transmitting data out of the processing element, and the data being transmitted out of the processing element. An exemplary read API and write API are listed below.

PE_READ (channel, 1-D offset, 2-D offset, feedback, flags, initialization value)
PE_WRITE (channel, data)

The exemplary read API and write API listed above may instantiate a read connection between two processing elements and a write connection between two processing elements. Each processing element will associate the identity of a connection with the "channel" argument. The "offset" arguments identify a processing element which data is being transmitted from by providing a direction of the processing element. For the write API, no "offset" argument is provided since data is assumed to be transmitted in the same direction from which it was received. For some systolic arrays, it may be necessary for a processing element at one end of a matrix to feedback data to another end. The "feedback" argument may be used to identify a feedback path. In order to address special cases, such as the initialization of a processing element and loading of data from an external an external source, the "flags" argument is provided. The "data" argument is provided to identify data that is output on a write connection.

For connections between processing elements and external interfaces, the user may also provide a read API to describe a connection that inputs data to the processing element, and a write API to describe a connection that outputs data from the processing element. The read API may be identify a name of the connection transmitting data to a processing element and flags. The write API may identify a name of the connection transmitting data out of the processing element, and the data being transmitted out of the processing element. An exemplary read API and write API between a processing element and an external interface are listed below.

EXT_READ (channel, flags)
EXT_WRITE (channel, data)

The exemplary read API and write API listed above may instantiate a read connection between a processing element and an external channel and a write connection between a processing element and an external channel. Each processing element will associate the identity of a connection with the "channel" argument. In order to address special cases, such as the initialization of a processing element and loading of data from an external an external source, the "flags" argument is provided. The "data" argument is provided to identify data that is output to the external interface.

If the APIs listed above are used to describe a processing element that is replicated throughout a processing array, an API that identifies a unique processing element that support different connections may be used. An exemplary API that may be used to identify the unique processing element is listed below.

PE (x, y)

The arguments x and y are provided to allow a user to identify which processing element in a matrix of processing elements of a systolic array is the unique processing element. The connections associated with this unique processing element may be described following this API.

Figure 4:
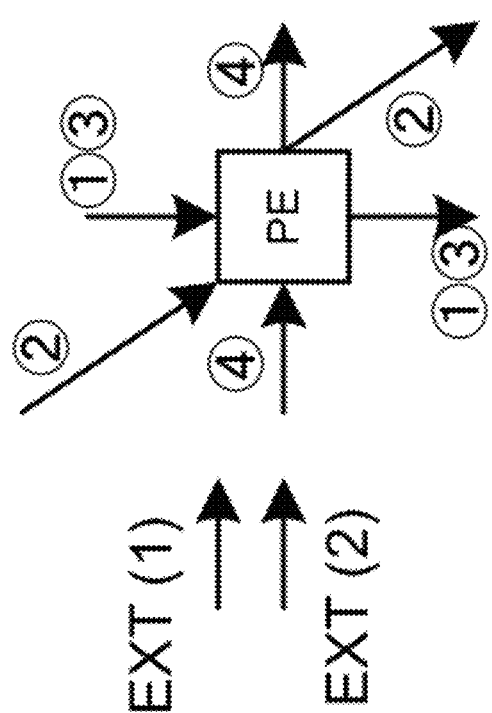
FIG. 4 illustrates channels associated with a processing element as described in a functional description according to an embodiment of the present invention.

FIG. 4 illustrates an exemplary processing element 400 and its associated channels according to an embodiment of the present invention. Arrows labeled with a number in a circle represent a connection (internal channel) between the processing element 400 and another processing element. Arrows labeled with a prefix "EXT" represent a connection (external channel) between the processing element 300 and an external component (not shown).

The following APIs may be used to describe internal channel 2.

PE_READ (2, −1, −1, TRUE, INIT |FIRST| ONCE, INITVAL)
PE_WRITE (2, score)

The read API identifies the name of channel 2, "2" in its first argument. The read API identifies the location or direction of the transmitting processing element that is sending data on internal channel 2 in the second and third arguments. In this example, the values "−1, −1" represent directional coordinates of the transmitting processing element. "INIT|FIRST|ONCE" means that the very first PE in the −1, −1 direction will initialize the PEs with a pre-defined initialization value. This will be used to start the PE execution.

The write API also identifies the name of the channel 2, "2" in its first argument. The write API includes a second argument which describes the data, "score", computed by the processing element which is transmitted. The APIs describing internal channels 1, 3, and 4 are illustrated on FIG. 3.

Figure 5:
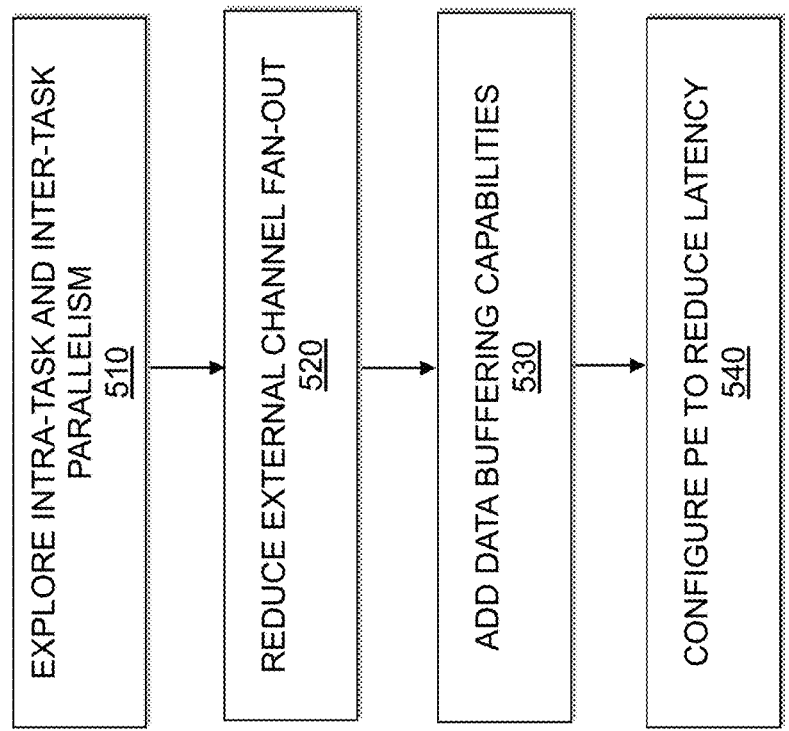
FIG. 5 is a flow chart illustrating a method for performing optimization on the high-level synthesis language according to an embodiment of the present invention.

FIG. 5 is a flow chart illustrating a method for performing optimization on the high-level synthesis language according to an embodiment of the present invention. According to an embodiment of the present invention, the procedures shown in FIG. 5 may be used to implement procedure 120 shown in FIG. 1. At 510, intra-task and inter-task parallelism are explored for the systolic array. With intra-task parallelism, an algorithm utilizes parallelism on only a given data set. With inter-task parallelism, an algorithm utilizes parallelism across many data set. Intra-task parallelism may be attempted first to see if there are any idling processing elements (pipeline bubbles). If there are, this might mean that the pipeline is not fully utilized. As a result, additional independent inputs are fed to the processing elements. According to an embodiment of the present invention, additional processing units are considered to implement the system to allow for inter-task parallelism to be practiced in addition to intra-task parallelism. In one embodiment, additional dimensions are considered for the typology of the systolic array. For example, if a single dimension systolic array is implemented for a system, the operation for the single dimension systolic array is compared with the operation of a multi-dimensional systolic array implemented for the system. If utilizing the multi-dimensional systolic array improves performance, the typology of the systolic array is modified to support additional dimensions. It should be appreciated that other techniques for supporting inter-task parallelism may be utilized.

Figure 6B:
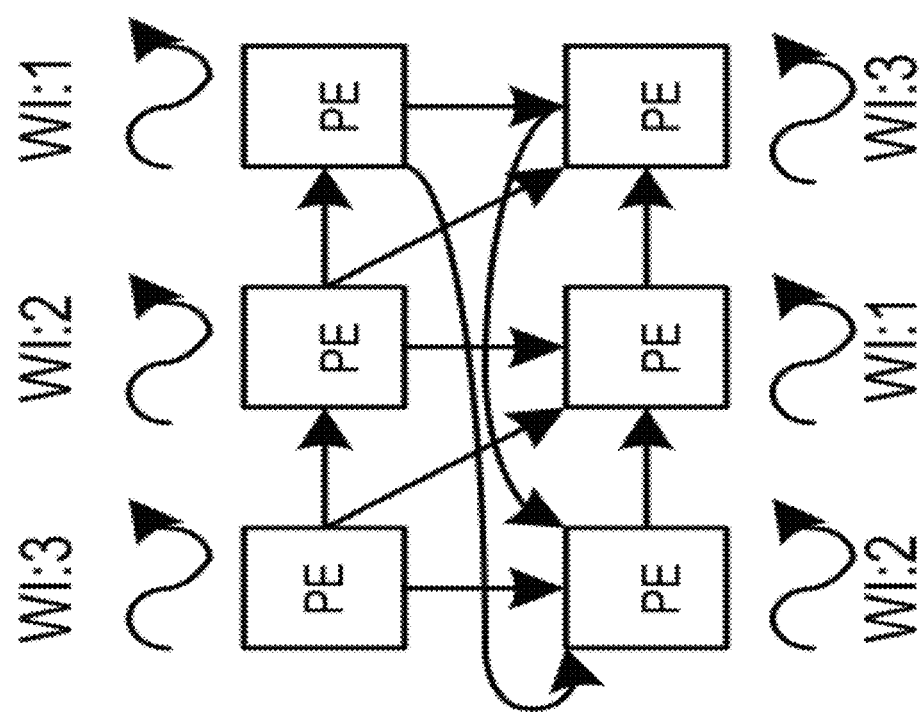
FIGS. 6A and 6B illustrate an example of intra-task parallelism and intra-task parallelism with inter-task parallelism according to an embodiment of the present invention.
Figure 6A:
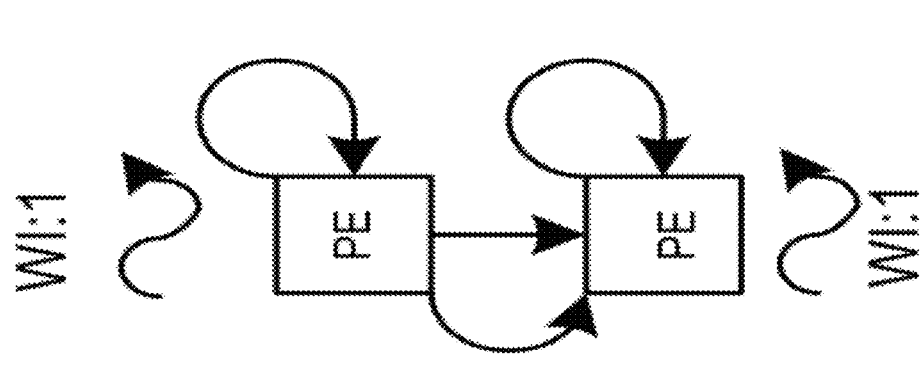

FIG. 6A illustrates a single dimension systolic array. The single dimensional systolic array uses two processing units to implement one work-item to accommodate one query sequence at a time. As shown, the processing elements in FIG. 6A are sufficient to process data as each database sequence has dependency from a previous processing element. Utilizing additional processing element rows would not improve processing throughput. FIG. 6B illustrates a two dimensional systolic array. The two dimensional systolic array uses 6 processing elements to implement three work-items to accommodate multiple independent query sequences. As shown, if three independent database sequences are fed into the two dimensional systolic array at the same time, each sequence could be processed in a pipelined fashion. While the single dimension systolic array illustrated in FIG. 6A allowed the system to perform intra-task parallelism, the two dimensional systolic array illustrated in FIG. 6B allowed the system to perform both intra-task parallelism and inter-task parallelism. According to an embodiment of the present invention, the high-level synthesis language is used to feed each query sequences into a pipeline. Referring back to FIG. 5, at 520, external channel fanout is reduced. According to an embodiment of the present invention, the dependencies of the processing elements in the systolic array are examined. It is determined whether processing elements that are identified to have a dependency on a producer (external data transmitters) may be provided with data from the producer via a neighboring processing element. If a processing element having dependency on the producer may be provided with the data from a neighboring processing element in a manner that satisfies timing constraints, a connection is provided to receive the data from the neighboring processing element and the connection to the producer is eliminated.

Figure 7A:
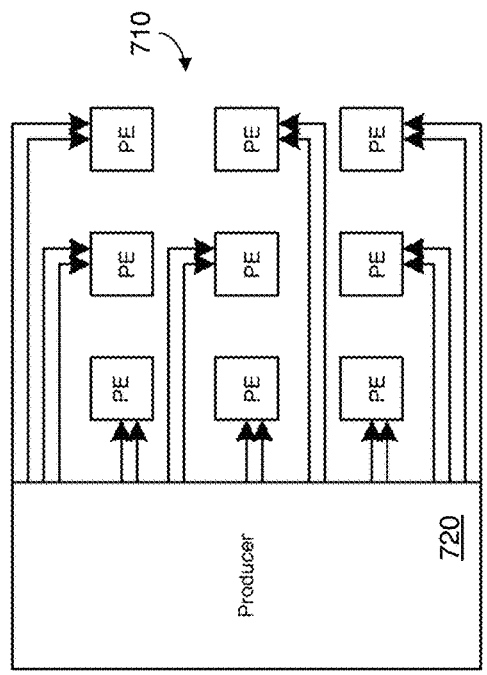
FIGS. 7A and 7B illustrate an example of external channel fan-out minimization according to an embodiment of the present invention.
Figure 7B:
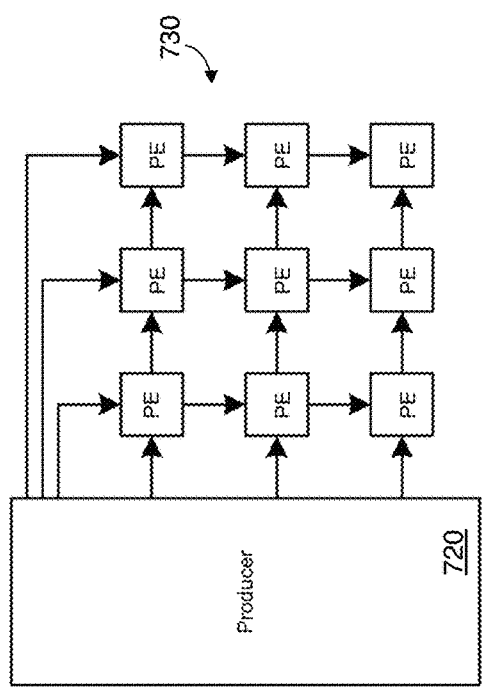

FIG. 7A illustrates an example of a systolic array 710 as described by a high-level synthesis language. The systolic array has each of its processing elements (PEs) directly coupled to the producer 720 to receive data directly from the producer 720. FIG. 7B illustrates an example of the systolic array 730 after external channel fanout reduction is performed. In this example, a number of processing elements have been identified that may receive the data from a neighboring processing element in a manner satisfying timing constraints. Direct connections from the producer 720 are eliminated for these processing elements and are replaced with connections to a neighboring processing element.

Referring back to FIG. 5, at 530, data buffering capabilities are added to the systolic array. One limitation of high-level synthesis language is that it does not define data types with bit granularity. This may result in inefficient data packing. To address this, processing elements in the systolic array may be implemented with data buffering capabilities. According to an embodiment of the present invention, a register is provided in the PE which receives data. The register may be configured to be a length that is appropriate for optimal data transfer. The register buffers the data and data is transmitted out of the buffer only after the buffer is full. This reduces the frequency of access of the processing element.

Figure 8:
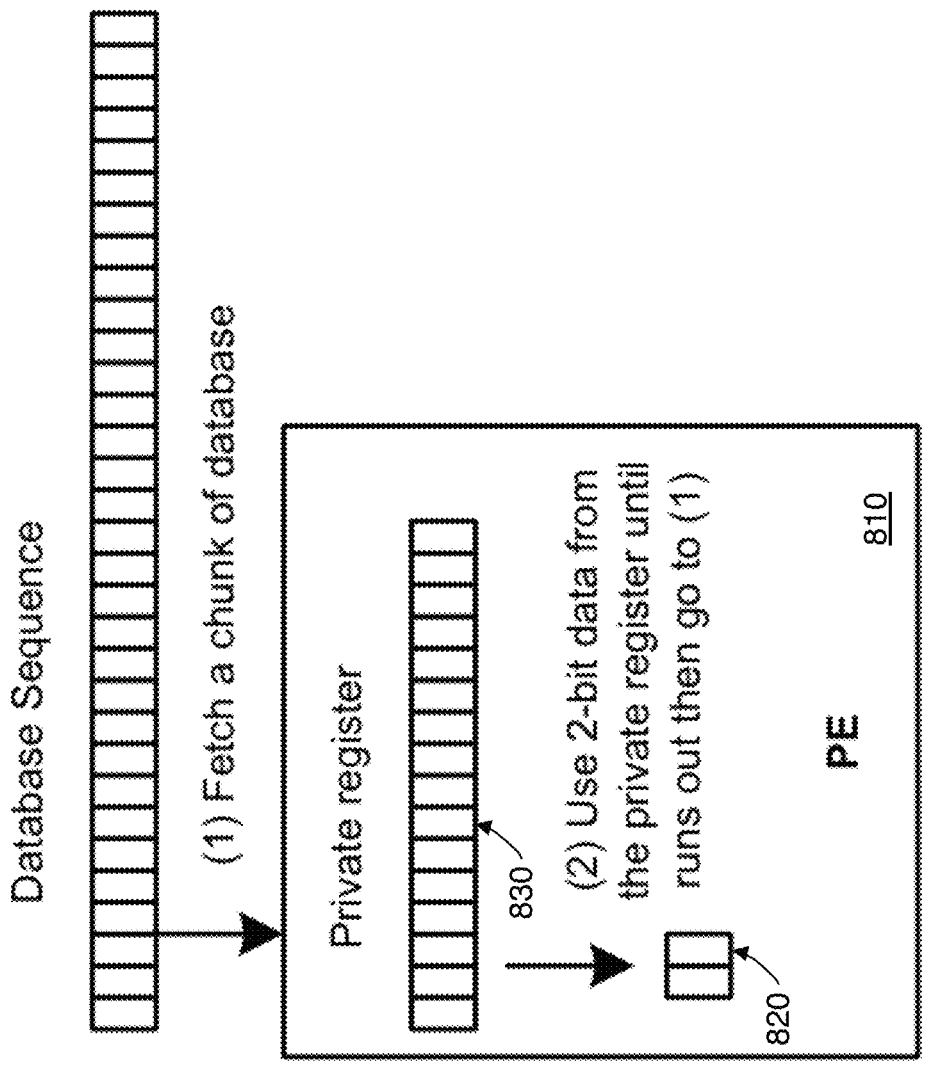
FIG. 8 illustrates an example of data buffering in a processor element according to an embodiment of the present invention.

FIG. 8 illustrates an example of data buffering in a processor element 810 according to an embodiment of the present invention. Data is written into the processing element (PE) 810 in 2-bit data increments into a storage 820. The 2-bit data increments are loaded into a register 830. Instead of accessing the storage 820, the register 830 is accessed with a reduced frequency.

Figure 9:
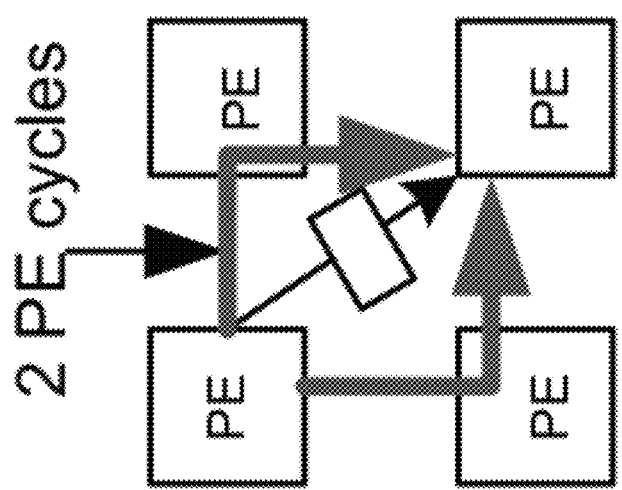
FIG. 9 illustrates an example of latency optimization according to an embodiment of the present invention.

Referring back to FIG. 5, at 540, processing elements are configured to reduce latency. Connections between processing elements are configured with a zero-depth first-in-first-outs (FIFOs). An exception is made for diagonal connections between processing elements. Diagonal connections between processing elements are provided with a FIFO of depth 1 to accommodate for delays associated with transmitting data between two processing elements. FIG. 9 illustrates an example of the latency provided between processing elements.

Figure 10:
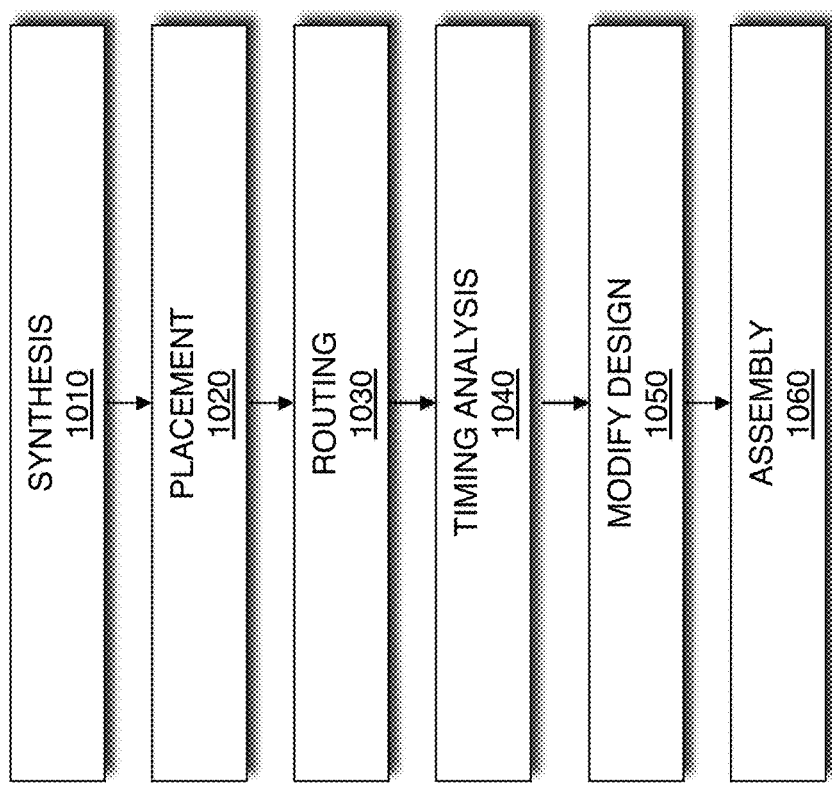
FIG. 10 is a flow chart illustrating a method for performing HDL compilation according to an embodiment of the present invention.

FIG. 10 is a flow chart illustrating a method for performing HDL compilation according to an embodiment of the present invention. According to an embodiment of the present invention, the procedures illustrated in FIG. 10 may be used to implement procedure 140 shown in FIG. 1. At 1010, the system is synthesized. Synthesis includes generating a logic design of the system to be implemented by the target device. According to an embodiment of the present invention, synthesis generates an optimized logical representation of the system from an HDL design definition. Synthesis also includes mapping the optimized logic design. Mapping includes determining how to implement logic gates and logic elements in the optimized logic representation with specific resources on the target device. According to an embodiment of the present invention, a netlist is generated from mapping. This netlist may be an optimized technology-mapped netlist generated from the HDL.

At 1020, the system is placed. According to an embodiment of the present invention, placement involves placing the mapped logical system design on the target device. Placement works on the technology-mapped netlist to produce a placement for each of the functional blocks. According to an embodiment of the present invention, placement includes fitting the system on the target device by determining which resources on the logic device are to be used for specific logic elements, and other function blocks, determined to implement the system during synthesis. Placement may include clustering which involves grouping logic elements together to form the logic clusters present on the target device. According to an embodiment of the present invention, clustering is performed at an early stage of placement and occurs directly after synthesis during the placement preparation stage.

At 1030, the placed design is routed. During routing, routing resources on the target device are allocated to provide interconnections between logic gates, logic elements, and other components on the target device. Routability optimization may also be performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 1040, timing analysis is performed on the system designed by procedures 1010, 1020, and 1030. According to an embodiment of the present invention, the timing analysis determines whether timing constraints of the system are satisfied. As part of timing analysis, slack analysis may be performed.

At 1050, the design for the system is modified in response to the timing analysis. According to an embodiment of the present invention, the design for the system may be modified in response to determining that timing constraints have not been satisfied. The design for the system may be modified by a designer manually or alternatively the design may be modified automatically by the EDA tool by re-executing one or more of procedures 1010, 1020, and 1030.

At 1060, an assembly procedure is performed. The assembly procedure involves creating a program file that includes information determined by the procedures described at 1010, 1020, 1030, 1040, and 1050. The program file may be a bit stream that may be used to program a target device.

According to an embodiment of the present invention, the procedures illustrated in FIGS. 1, 2, 5, and 10 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium. The target device may be programmed with the data file. By programming the target with the data file, components on the target device are physically transformed to implement the system.

FIGS. 1, 2, 5, and 10 are flow charts that illustrate embodiments of the present invention. The procedures described in these figures may be performed by an EDA tool implemented by a computer system. Some of the techniques illustrated may be performed sequentially, in parallel or in an order other than that which is described and that the procedures described may be repeated. It is appreciated that not all of the techniques described are required to be performed, that additional techniques may be added, and that some of the illustrated techniques may be substituted with other techniques.

Figure 11:
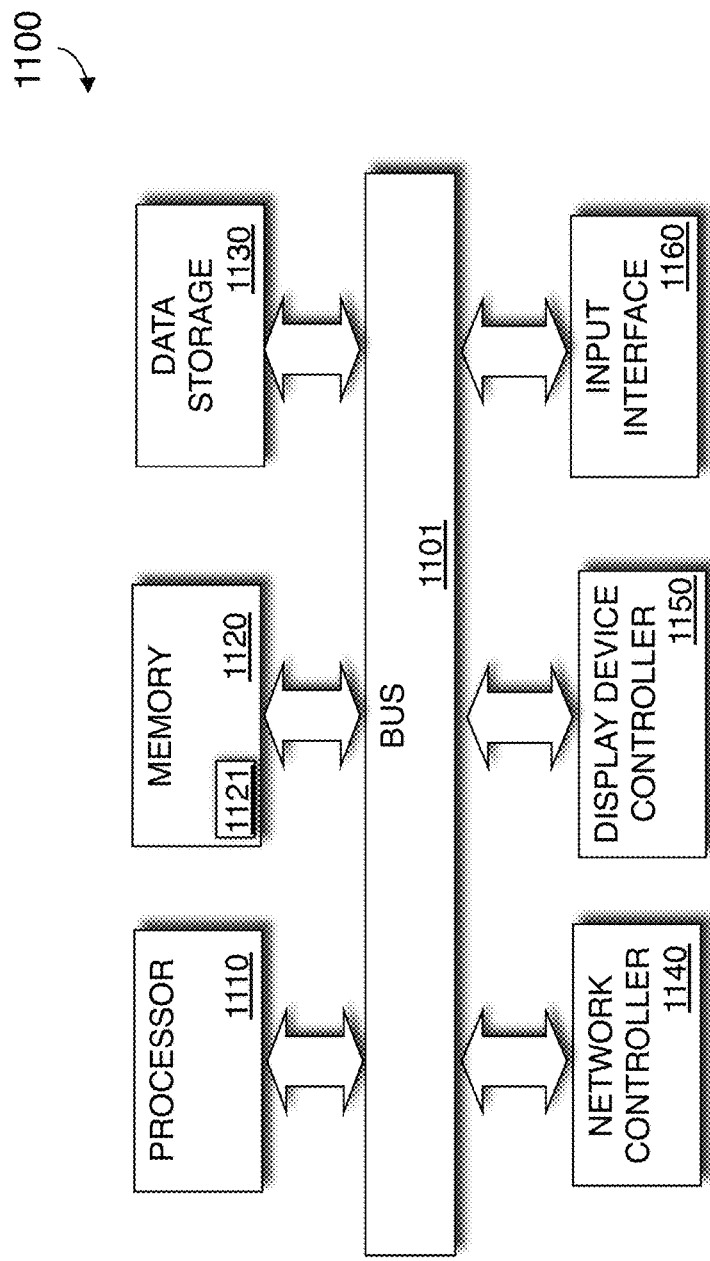
FIG. 11 illustrates a block diagram of a computer system implementing a system designer according to an embodiment of the present invention.

FIG. 11 is a block diagram of an exemplary computer system 1100 in which an example embodiment of the present invention resides. The computer system 1100 includes a processor 1110 that process data signals. The processor 1110 is coupled to a bus 1101 or other switch fabric that transmits data signals between processor 1110 and other components in the computer system 1100. The computer system 1100 includes a memory 1120. The memory 1120 may store instructions and code represented by data signals that may be executed by the processor 1110. A data storage device 1130 is also coupled to the bus 1101

A network controller 1140 is coupled to the bus 1101. The network controller 1140 may link the computer system 1100 to a network of computers (not shown) and supports communication among the machines. A display device controller 1150 is coupled to the bus 1101. The display device controller 1150 allows coupling of a display device (not shown) to the computer system 1100 and acts as an interface between the display device and the computer system 1100. An input interface 1160 is coupled to the bus 1101. The input interface 1160 allows coupling of an input device (not shown) to the computer system 1100 and transmits data signals from the input device to the computer system 1100.

A system designer 1121 may reside in the memory 1120 and be executed by the processor 1110. According to an embodiment of the present invention, the system designer 1121 may generate a description of a generic multi-dimensional systolic array from a scripting language. The description may adapt to a high-level synthesis language such as OpenCL, Impulse C, or other high-level synthesis language that may be converted into a hardware description language. The system designer 1121 may prompt a user to input information about the systolic array. A high-level synthesis language is generated that describes channels of processing elements of the systolic array and a typology of the processing elements in response to the information provided by the user. According to an aspect of the present invention, the high-level synthesis language further describes, data transmitters and data receivers associated with the systolic array, an external interface associated with the systolic array, and/or channels associated with the processing elements of the systolic array. According to an aspect of the present invention, optimizations are performed on the high-level synthesis language that describes the systolic array.

Figure 12:
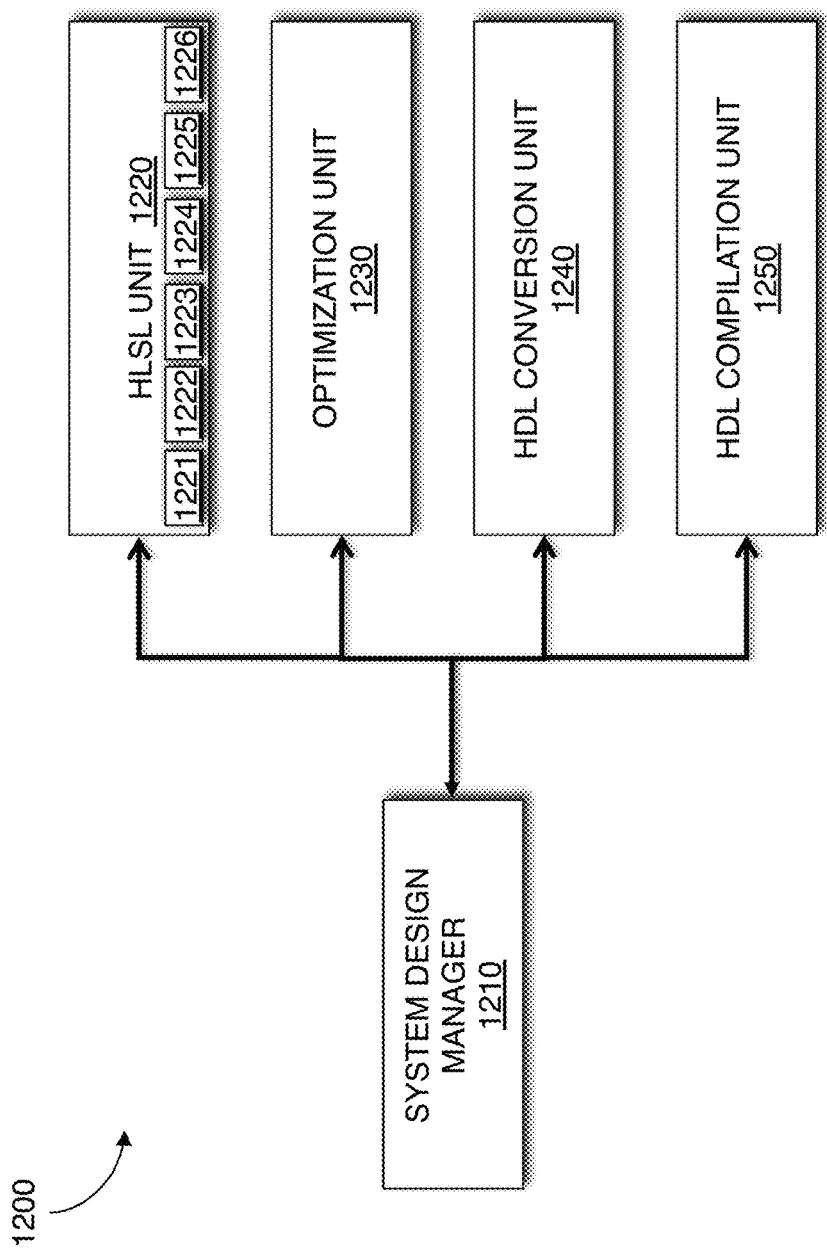
FIG. 12 is a block diagram of a system designer according to an embodiment of the present invention.

FIG. 12 illustrates a system designer 1200 according to an embodiment of the present invention. The system designer 1200 may be an EDA tool for designing a system on a target device such as an FPGA, structured application-specific integrated circuit (ASIC), ASIC, or other circuitry. FIG. 12 illustrates modules implementing an embodiment of the system designer 1200. According to one embodiment, the modules represent software modules and system design may be performed by a computer system such as the one illustrated in FIG. 11 executing sequences of instructions represented by the modules shown in FIG. 12. Execution of the sequences of instructions causes the computer system to support system design as will be described hereafter. In alternate embodiments, hard-wire circuitry may be used in place of or in combination with software instructions to implement embodiments of present invention. Thus, embodiments of present invention are not limited to any specific combination of hardware circuitry and software.

The system designer 1200 includes a designer manager 1210. The designer manager 1210 is connected to and transmits data between the components of the system designer 1200.

The system designer 1200 includes a high-level synthesis language (HLSL) unit 1220. The high-level synthesis unit 1220 generates a description of a system in high-level synthesis language from information about the system provided by a user. The information about the system may be in the format of a script or computer language. According to an embodiment of the present invention, the high-level synthesis language unit 1220 includes a graphical user interface unit 1221 configured to prompt a user to enter information about the systolic array. The graphical user interface unit 1221 may prompt the user for specific information about the systolic or prompt the user to input information which the user deems important in describing the systolic array. The high-level synthesis language unit 1200 also includes a typology generation unit 1222. The typology generation unit 1222 generates a description of the typology of the systolic array in response to a dimension of the systolic array provided in the information. The high-level synthesis unit 1200 also includes a processing unit generation unit 1223. The processing unit generation unit 1223 generates a description of components in the processing elements in response to an algorithmic description of the processing elements provided in the information. The high-level synthesis unit 1200 also includes a connection generation unit 1224. The connection generation unit 1224 generates connections (channels) between processing elements in response to a functional description provided in the information. The functional description identifies external and internal channels connected to each of the processing elements and the direction data is traveling on each of the channels. The high-level synthesis unit 1200 also includes a transmitter/receiver generation unit 1225. The transmitter/receiver generation unit 1225 generates a description of data transmitters and data receivers that are coupled to the processing elements via external channels in response to the information. The high-level synthesis unit 1200 also includes an external interface generation unit 1226. The external interface generation unit 1226 generates a description of the external interface in response to the information.

The system designer 1200 includes an optimization unit 1230. The optimization unit 1230 applies an appropriate set of optimizations based upon the system (systolic array), platform or target device which the system is implemented on in order to improve throughput and performance. The optimizations applied may include parallelism expansion, external channel fan-out minimization, data buffering, and latency reduction as described with reference to FIG. 5.

The system designer 1200 includes an hardware description language (HDL) conversion unit 1240. The HDL conversion unit 1240 converts the high-level synthesis language description of the system into hardware HDL. The HDL description provides high-level representations of a circuit in terms of the flow of signals (or transfer of data) between hardware registers, and the logic operations performed on those signals. The HDL may be, for example, Verilog, VHDL or other hardware description language.

The system designer 1200 includes a HDL compilation unit 1250. According to an embodiment of the present invention, the HDL compilation unit 1250 performs synthesis, placement, routing, and timing analysis on the HDL of the system as described with reference to FIG. 10.

It should be appreciated that embodiments of the present invention may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 13:
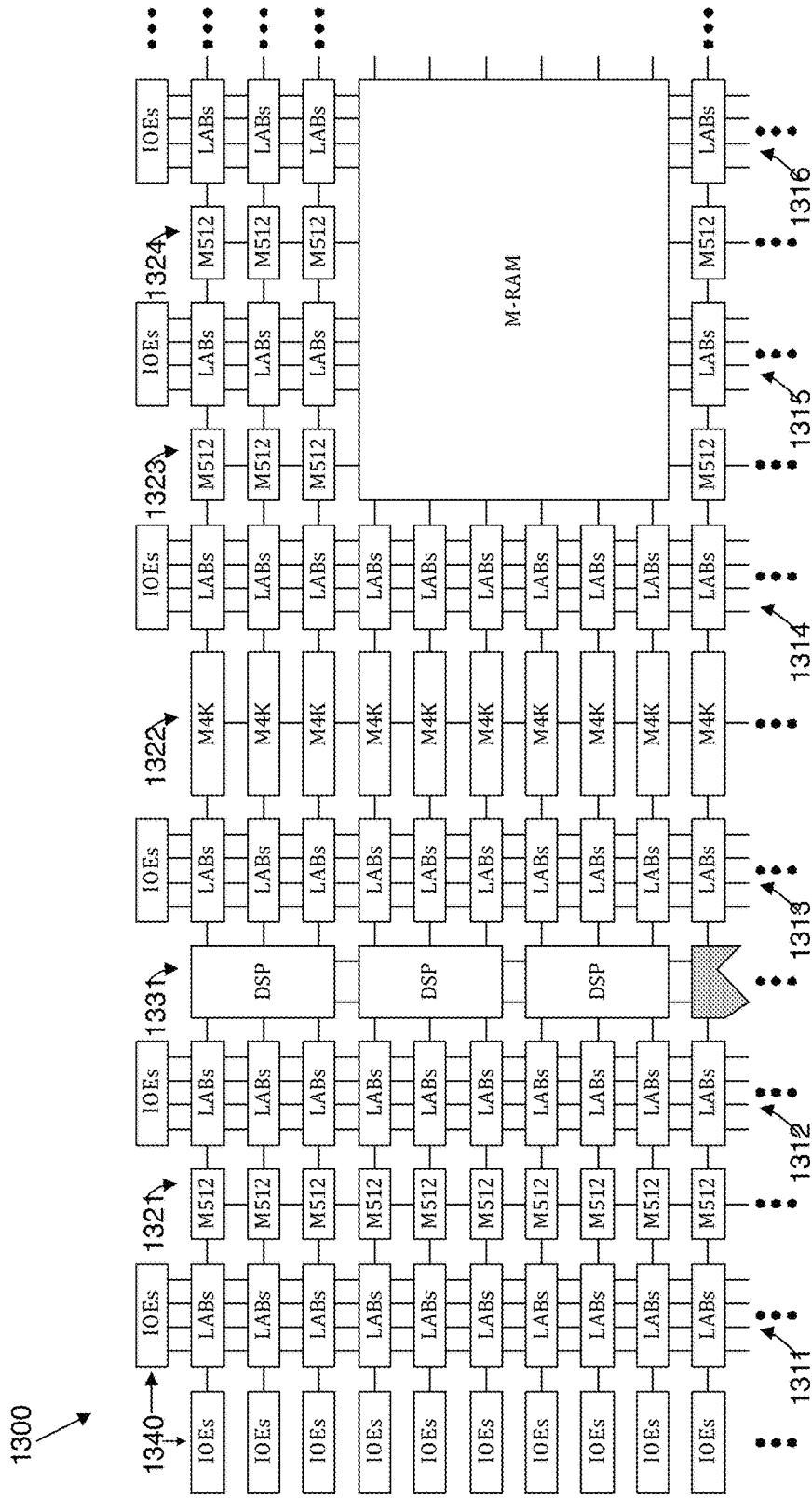
FIG. 13 illustrates an exemplary target device operable to be programmed with a compression/decompression unit according to an embodiment of the present invention.

FIG. 13 illustrates a device 1300 that may be used to implement a target device according to an embodiment of the present invention. The device 1300 is a field programmable gate array (FPGA) that includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input LUT with a configurable register. According to an alternate embodiment of the present invention, the logic block may operate similarly to an adaptive logic module (ALM), such as those found in Stratix devices manufactured by Altera Corporation. LABs are grouped into rows and columns across the device 1300. Columns of LABs are shown as 1311-1316. It should be appreciated that the logic block may include additional or alternate components.

The device 1300 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 1300. Columns of memory blocks are shown as 1321-1324.

The device 1300 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 1300 and are shown as 1331.

The device 1300 includes a plurality of input/output elements (IOEs) 1340. Each IOE feeds an IO pin (not shown) on the device 1300. The IOEs 1340 are located at the end of LAB rows and columns around the periphery of the device 1300. Each IOE may include a bidirectional IO buffer and a plurality of registers for registering input, output, and output-enable signals.

The device 1300 may include routing resources such as LAB local interconnect lines, row interconnect lines ("H-type wires"), and column interconnect lines ("V-type wires") (not shown) to route signals between components on the target device.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for generating a description of a systolic array, comprising:
   prompting a user to input information about the systolic array to be implemented on a target device; and
   generating a high-level synthesis language that describes channels of processing elements of the systolic array and a topology of the processing elements from the information provided by the user; and
   reducing clock latency for the processing elements by creating a zero-depth FIFO for each non-diagonal processor element connection.

2. The method of claim 1, wherein the high-level synthesis language further describes data transmitters and data receivers associated with the systolic array.

3. The method of claim 1, wherein the high-level synthesis language further describes an external interface associated with the systolic array.

4. The method of claim 1, wherein the high-level synthesis language further describes components in the processing elements of the systolic array.

5. The method of claim 1 further comprising performing optimizations on the high-level synthesis language.

6. The method of claim 5, wherein performing optimizations on the high-level synthesis language comprises performing external channel fan-out minimization.

7. The method of claim 5, wherein performing optimizations on the high-level synthesis language comprises performing data buffering in the processing elements.

8. The method of claim 5, wherein performing optimizations on the high-level synthesis language comprises reducing clock latency for the processing elements.

9. The method of claim 1, wherein prompting the user to provide information about the systolic array comprises prompting the user to provide a functional description of the processing elements and a dimension of the processing elements in a computer language format.

10. The method of claim 1, wherein the high-level synthesis language is OpenCL.

11. The method of claim 1, wherein generating the description of the channels of processing elements is performed in response to a functional description of the processing elements provided by the user.

12. The method of claim 1, wherein generating the topology of the processing elements is performed in response to a dimension of the systolic array provided by the user.

13. The method of claim 1 further comprising generating a description of components in the processing elements in the systolic array in response to an algorithmic description of the processing elements provided by the user.

14. A method for generating a description of a systolic array in a high-level synthesis language, comprising:
   generating a description of a typology of the systolic array to be implemented on a target device in response to a dimension of the systolic array;
   generating a description of components in processing elements in the systolic array in response to an algorithmic description of the processing elements; and
   generating a description of channels between the processing elements in response to a functional description of the processing elements; and
   reducing clock latency for the processing elements by creating a zero-depth FIFO for each non-diagonal processor element connection.

15. The method of claim 14 further comprising optimizing the systolic array by performing external channel fan-out minimization.

16. The method of claim 14 further comprising adding data buffers in the processing elements.

17. The method of claim 14, wherein the high-level synthesis language is OpenCL.

18. A non-transitory computer readable medium including a sequence of instructions stored thereon for causing a computer to execute a method, comprising:
   prompting a user to input information about a systolic array to be implemented on a target device; and
   generating a high-level synthesis language that describes a typology of the systolic array and components in processing elements of the systolic array in response to the information provided by the user; and
   modifying the high-level synthesis language by performing parallelism expansion, external channel fan-out minimization, data buffering, and latency reduction.

19. The non-transitory computer readable medium of claim 18, wherein generating the high-level synthesis language comprises:
   generating a description of the typology of the systolic array in response to a dimension of the systolic array; and
   generating a description of the components in the processing elements in the systolic array in response to an algorithmic description of the processing elements.

20. The non-transitory computer-readable medium of claim 19, wherein the method further comprises converting the high-level synthesis language to hardware description language.

21. The non-transitory computer-readable medium of claim 19, wherein the converting comprises converting kernel functions in the high-level synthesis language to hardware components to implement the kernel functions in the hardware description language.

22. The non-transitory computer readable medium of claim 18, wherein the method further comprises generating a description of channels between the processing elements in response to a functional description of the processing elements.

23. The non-transitory computer readable medium of claim 18, wherein the method further comprises performing optimizations on the high-level synthesis language that describes the systolic array.

24. The non-transitory computer readable medium of claim 18, wherein the high-level synthesis language is OpenCL.

25. A system designer, comprising:
   a high-level synthesis language unit that generates a high-level synthesis language that describes a typology of a systolic array to be implemented on a target device and components in processing elements of the systolic array in response to information provided by the user; and
   an optimization unit that modifies the high-level synthesis language to improve throughput and performance, wherein the optimization unit modifies the high-level synthesis language by performing parallelism expansion, external channel fan-out minimization, data buffering, and latency reduction.

* * * * *